US009478051B2

United States Patent
Li et al.

(10) Patent No.: US 9,478,051 B2
(45) Date of Patent: Oct. 25, 2016

(54) METHOD FOR ACCELERATING MAGNETIC RESONANCE IMAGING USING VARYING K-SPACE SAMPLING DENSITY AND PHASE-CONSTRAINED RECONSTRUCTION

(71) Applicant: Albert-Ludwigs-Universitaet Freiburg, Freiburg (DE)

(72) Inventors: Guobin Li, Freiburg (DE); Maxim Zaitsev, Freiburg (DE); Juergen Hennig, Freiburg (DE)

(73) Assignee: Albert-Ludwigs-Universitaet Freiburg, Freiburg (DE)

( * ) Notice: Subject to any disclaimer, the term of this patent is extended or adjusted under 35 U.S.C. 154(b) by 0 days.

(21) Appl. No.: 14/644,221

(22) Filed: Mar. 11, 2015

(65) Prior Publication Data

US 2015/0279065 A1 Oct. 1, 2015

(30) Foreign Application Priority Data

Mar. 28, 2014 (EP) .................................. 14162404

(51) Int. Cl.
*G06K 9/00* (2006.01)
*G06T 11/00* (2006.01)
*G01R 33/561* (2006.01)
*G01R 33/48* (2006.01)

(52) U.S. Cl.
CPC .......... *G06T 11/008* (2013.01); *G01R 33/561* (2013.01); *G01R 33/5611* (2013.01); *G01R 33/4822* (2013.01); *G01R 33/4826* (2013.01); *G06T 2207/10004* (2013.01); *G06T 2207/10088* (2013.01)

(58) Field of Classification Search
CPC ...... A61B 5/055; A61B 5/7257; A61B 5/00; G06T 2207/10088; G06T 2207/30004; G06T 2211/424; G01F 1/56
See application file for complete search history.

(56) References Cited

U.S. PATENT DOCUMENTS

| 7,592,808 | B1 | 9/2009 | King | |
|---|---|---|---|---|
| 8,089,278 | B1 | 1/2012 | Du | |
| 8,886,283 | B1 * | 11/2014 | Chen | G01R 33/561 382/128 |
| 2005/0058368 | A1 * | 3/2005 | Moriguchi | G01R 33/285 382/280 |
| 2005/0074152 | A1 * | 4/2005 | Lewin | G01R 33/561 382/128 |
| 2011/0105890 | A1 * | 5/2011 | Niendorf | G01R 33/4833 600/413 |
| 2012/0229136 | A1 * | 9/2012 | Stemmer | G01R 33/5659 324/307 |

OTHER PUBLICATIONS

Liang et al., "An Efficient Method for Dynamic Magnetic Resonance Imaging", IEEE Transactions on Medical Imaging, vol. 13, No. 4, Dec. 1994, pp. 677-686.*
Guobin Li, et al., "Partial Fourier acquisition with centric circular reference lines in 3D MRI", Proc. Intl. Soc. Mag. Reson. Med. 20 (2012).

(Continued)

*Primary Examiner* — Vu Le
*Assistant Examiner* — Guillermo Rivera-Martinez
(74) *Attorney, Agent, or Firm* — Paul Vincent

(57) ABSTRACT

A method is presented for accelerating magnetic resonance imaging. In 3D MRI, the k-space in the phase encoding plane is divided into two symmetric parts and three asymmetric parts. Different sampling densities are applied in different parts. Images are reconstructed by iteratively minimizing a cost function when random sampling is applied in each part. A phase constraint term is added into the cost function to improve the quality of the reconstruction by exploiting the conjugate symmetry of k-space.

7 Claims, 1 Drawing Sheet

(56) References Cited

OTHER PUBLICATIONS

D. Rettmann et al., "Differential Subsampling with Cartesian Ordering (DISCO): a novel k-space ordering scheme for dynamic MRI", Proceedings of the International Society for Magnetic Resonance in Medicine, ISMRM, 18th Scientific Meeting and Exhibition, Stockholm, Sweden, May 1-7, 2010, Apr. 17, 2010, p. 3044.

J. A. Fessler et al., "Iterative image reconstruction in MRI with separate magnitude and phase regularization", Biomedical Imaging: Macro to Nano, 2004, IEEE International Symposium on Arlington, VA, USA, Apr. 15-18, 2004, Piscataway, NJ., USA, IEEE, Apr. 15, 2004, Pa. 209-212.

E.M. Haacke et al., "Image reconstruction using projection onto convex sets, model constraints, and linear prediction theory for the removal of phase, motion, and Gibbs artifacts in magnetic resonance and ultrasound imaging", 2417 Optical Engineering, (May 29, 1990), No. 5, Bellingham, WA, US.

A. Samsonov et al., "Adaptive Phase-Constrained Reconstruction for Partial Fourier Partially Parallel Imaging", Proc. Intl. Soc. Mag. Reson. Med. 13 (2005).

P.C. Lauterbur "Image Formation by Induced Local Interactions: Examples Employing Nuclear Magnetic Resonance", Nature, vol. 242, Mar. 16, 1973.

Michael Bomans et al., "Improvement of 3D Acquisition and Visualization in MRI", Magnetic Resonance Imaging, vol. 9, pp. 597-609, 1991.

L. Feng et al., "Combination of Compressed Sensing, Parallel Imaging and Partial Fourier for Highly-Accelerated 3D First-Pass Cardiac Perfusion MRI", Proc. Intl. Soc. Mag. Reson. Med. 19 (2011).

F. Liu et al., "Compressed sensing MRI combined with SENSE in partial k-space", Phys.Med.Biol. 57, (2012), N391-N403.

Douglas C. Noll et al., "Homodyne Detection in Magnetic Resonance Imaging", IEEE Transactions on Medical Imaging, vol. 10, No. 2, Jun. 1991.

E.M. Haacke et al., "A Fast, Iterative, Partial-Fourier Technique Capable of Local Phase Recovery", Journal of Magnetic Resonance 92, 126-145 (1991).

Michael Lustig et al., "Sparse MRI: The Application of Compressed Sensing for Rapid MR Imaging", Magnetic Resonance in Medicine 58:1182-1195 (2007).

Mark A. Griswold et al., "Generalized Autocalibrating Partially Parallel Acquisitions (GRAPPA)", Magnetic Resonance in Medicine 47:1202-1210 (2002).

M. Doneva et al., "Partial Fourier Compressed Sensing" ISMRM 2010 : 485.

* cited by examiner

METHOD FOR ACCELERATING MAGNETIC RESONANCE IMAGING USING VARYING K-SPACE SAMPLING DENSITY AND PHASE-CONSTRAINED RECONSTRUCTION

This application claims Paris convention priority from EP 14 162 404.9 filed Mar. 28, 2014 the entire disclosure of which is hereby incorporated by reference.

BACKGROUND OF THE INVENTION

The present invention relates to a magnetic resonance imaging method for the acquisition of a three-dimensional dataset, where spatial encoding by three mutually orthogonal magnetic field gradients is performed such, that signal is readout under a read-gradient in one spatial direction $k_1$ and spatial encoding in the other two spatial directions $k_2$ and $k_3$ is performed by applying phase encoding gradients in the other two spatial directions prior to signal acquisition and data acquisition is performed in a sequential manner such that at each acquisition step signal is acquired under the said readout gradient, but with different combinations of the two phase encoding gradients.

A method of this type is known as 3DFT (or volume) imaging described in Reference [0] M. Bomans, K. Hohne, G. Laub, A. Pommert, U. Tiede, Improvement of 3D acquisition and visualization in MRI. Magn. Reson. Imaging 9, 597-609 (1991).

The present invention relates generally to magnetic resonance imaging (=MRI) technology. It specifically relates to data acquisition and image reconstruction methods as well as to spatial encoding for MRI.

Magnetic resonance imaging is a relative new technology compared with computed tomography (=CT) and the first MR Image was published in 1973 by P. C. Lauterbur in "Image Formation by Induced Local Interactions: Examples of Employing Nuclear Magnetic Resonance", Nature 242, 190491. It is primarily a medical imaging technique which most commonly used in radiology to visualize the structure and function of the body. It could provide detailed Images of the body in any plane. MRI provides much greater contrast between the different soft tissues of the body than CT does, making it especially useful in neurological, cardiovascular, and oncological imaging. It uses a powerful magnetic field to align the nuclear magnetization of hydrogen atoms in water in the body. Radio frequency fields are used to systematically alter the alignment of this magnetization, causing the hydrogen nuclei to produce a rotating magnetic field detectable by the scanner. This signal can be manipulated by additional magnetic fields to build up enough information to reconstruct an image of the body.

An MRI system typically establishes a homogenous magnetic field, generally along a central axis of a subject undergoing an MRI procedure. This homogenous main magnetic field affects the magnetic properties of the subject to be imaged by aligning the nuclear spins, in atoms and molecules forming the body tissue. If the orientation of the nuclear spins is perturbed out of alignment, the nuclei attempt to realign their spins with the field. Perturbation of the orientation of the nuclear spins is typically caused by application of radio frequency (RF) pulses tuned to the Larmor frequency of the material of interest. During the realignment process, the nuclei process about the direction of the main magnetic field and emit electromagnetic signals that may be detected by one or more RF detector coils placed on or around the subject.

Magnetic resonance imaging employs temporally and spatially variable magnetic fields to encode position by affecting the local Larmor frequency of spins. Gradient coils typically used for that purpose generate spatial encoding magnetic fields (=SEMs) which are superimposed on the main magnetic field. This allows to choose the localization of the image slices and also to provide phase encoding and frequency encoding. This encoding permits identification of the origin of resonance signals during image reconstruction. The image quality and resolution depends significantly on the strength and how the applied encoding fields can be controlled. Control of the gradient coils is generally performed in accordance with pre-established protocols or sequences at events, called pulse sequences, permitting different types of contrast mechanisms to be imaged.

In half Fourier imaging, part of the k-space data are left unacquired in order to shorten the measurement time in MRI, and the missing data are synthesized by exploiting the conjugate symmetry of k-space during reconstruction (also known as partial Fourier imaging). A rectangular sampling pattern is often used in multi-dimensional half Fourier imaging (see References [1], [2]).

Off-resonance effects and technical imperfections may lead to spatial phase variation in the acquired MR image, which destroys the conjugate symmetry of k-space. Two types of phase correction methods were developed to synthesize the unacquired data (see References [3], [4]). In these methods, the phase image in an intermediate result is completely replaced by an estimate during the data synthesis.

Recently developed k-space random sampling techniques (also known as "Compressed Sensing", see Reference [5]) were combined with Half Fourier acquisition to accelerate MRI (see References [2], [6]). In Reference [2], missing data in half Fourier imaging was reconstructed at a separate step using Homodyne detection method proposed in Reference [3]. In Reference [6], missing data in half Fourier imaging was reconstructed at a separate step using iterative POCS method proposed in Reference [4]. In all above methods, reconstructed image phase was directly replaced by the estimated phase, which may be inaccurate in some regions with rapid phase variation. Significant reconstruction errors exist in regions with poor phase estimation in these methods with 'direct' phase replacement.

The present invention presents a way to substantially overcome one or more disadvantages of the above discussed existing methods.

One object of the present invention is to propose a data acquisition method for half Fourier imaging in 3D MRI, where data are acquired under a readout gradient for spatial encoding in the first spatial dimension (referred to as $k_1$). Data in the $2^{nd}$ and $3^{rd}$ spatial dimension are spatially encoded according using two mutually orthogonal phase encoding gradients (referred to as $k_2$ and $k_3$). K-space undersampling is performed in the $k_2$-$k_3$ plane.

The k-space in said $k_2$-$k_3$ plane comprises five parts:
Part 1: symmetrically acquired area in central k-space.
Part 2: symmetrically acquired area, with higher spatial frequencies than that in Part 1.
Part 3: acquired area in lower half k-space, with higher spatial frequencies than that in Part 2.
Part 4: acquired area in upper half k-space, with higher spatial frequencies that that in Part 2.
Part 5: unacquired area in upper half k-space, with higher spatial frequencies that that in Part 4.
Part 1 in said k-space is fully sampled.

Part 2 in said k-space is undersampled with uniform sampling density.

Part 3 in said k-space is undersampled, with lower uniform sampling density than that in Part 2.

Part 4 in said k-space is undersampled, with lower uniform sampling density than that in Part 3.

Part 5 in said k-space is completely unacquired.

One option of the shape of said Part 2 and Part 4 is elliptical.

One option of the shape of said Part 2 and Part 4 is rectangular.

One option of data acquisition is to apply regular undersampling in said Part 2, Part 3 and Part 4 (see Reference [7]).

One option to data acquisition is to apply random undersampling in said Part 2, Part 3 and Part 4.

Another object of the present invention is to propose an image reconstruction method for the data set acquired by said k-space sampling pattern.

SUMMARY OF THE INVENTION

These objects are achieved by modifying the method discussed above in that a first subset of $k_2$-$k_3$ plane referred to as Part 1, which is symmetric around the k-space center, is fully sampled, a second subset of $k_2$-$k_3$ plane referred to as Part 2, which has higher spatial frequencies than that in Part 1 and is symmetric around the k-space center, is undersampled with uniform density, a third subset in lower half of $k_2$-$k_3$ plane referred to as Part 3, which has higher spatial frequencies than that in Part 2, is undersampled with uniform density, a fourth subset in upper half of $k_2$-$k_3$ plane referred to as Part 4, which has higher spatial frequencies than that in Part 2, is undersampled with uniform density, a fifth subset in upper half of $k_2$-$k_3$ plane referred to as Part 5, which has higher spatial frequencies than that in Part 4, is completely unacquired;

that the sampling density in Part 2 is lower than that in Part 1, the sampling density in Part 3 is lower than that in Part 2, the sampling density in Part 4 is lower than that in Part 3, no data are acquired in Part 5;

and that images are reconstructed by iteratively minimizing a cost function with descent algorithms like in the nonlinear conjugate gradient method, the cost function is a weighted summation of the multiple regularization terms, a phase constraint term is introduced into the cost function, the phase constraint term referred to as $R_{pc}$ is: $R_{pc}=\|g\|_1=\|(x \circ e^{-iP_R}-|x|) \circ W\|_1$, where x represents the intermediate solution in the iterative minimization, $\|g\|_1=\Sigma_k|g_k|$, $g_k$ is the $k_{th}$ element of matrix g; $A \circ B$ represents the Hadamard product of matrix A and matrix B; $|x|$ represents the magnitude of x; $P_R$ represents an estimate of the phase of the images to be reconstructed; W represents a weighting map.

The present invention proposes the following steps for the above discussed image reconstruction:

An Image (referred to as $I_R$) is reconstructed by only using the acquired data in said Part 1 and Part 2. The data in said Part 3, Part 4 and Part 5 are set to zero in the reconstruction of said $I_R$. The phase image (referred to as $P_R$) in said $I_R$ is extracted.

The final image (referred to as $I_F$) is obtained by iteratively minimizing a cost function $f_c$ using descent algorithms, for example nonlinear conjugate gradient method as proposed per se in Reference [5].

Said cost function $f_c$ can be expressed as the weighted summation of following regularization terms, but not limited to the listed terms:

$$f_c=\|U(Fx-y)\|_2^2+\lambda_{T1}\|\psi x\|_1+\lambda_{TV}TV(x)+\lambda_{pc}R_{pc}.$$

x represents the intermediate solution of $I_F$ in said process of iterative minimization; y is the acquired k-space data; F is the Fourier transform operator; U represents the k-space sampling mask with binary entries; ψ is a sparsifying transform operator (e.g. wavelet transform); TV is the total variation operator; $R_{pc}$ is a phase constraint term. $\lambda_{T1}$, $\lambda_{TV}$ are two real valued non-negative scalar factors; $\lambda_{pc}$ is a real valued positive scalar factor.

$R_{pc}$ in said cost function $f_c$ is expressed as: $R_{pc}=\|g\|_1=\|(x \circ e^{-iP_R}-|x|) \circ W\|_1$.

$\|g\|_1$ in said $R_{pc}$ can be expressed as $\|g\|_1=\Sigma_k|g_k|$. Where $g_k$ is the $k_{th}$ element of matrix g.

$A \circ B$ in said $R_{pc}$ represents the Hadamard product of matrix A and matrix B.

$|x|$ in said $R_{pc}$ represents the magnitude of x.

W in said $R_{pc}$ is a weighting map.

One option is that: said W=|x|. Said W is varying in the process of the iterative minimization. In order to find the descent direction in said iterative minimization of the cost function $f_c$, the gradient of said phase constraint term $R_{pc}$ is calculated:

The gradient of $R_{pc}$ is:

$$\nabla R_{pc} = \left(\frac{\partial R_{pc}}{\partial x}\right)^* = \left(\frac{\partial R_{pc}}{\partial g}\frac{\partial g}{\partial x} + \frac{\partial R_{pc}}{\partial \bar{g}}\frac{\partial \bar{g}}{\partial x}\right)^*.$$

Where $$\frac{\partial R_{pc}}{\partial g} = \left[\frac{\partial R_{pc}}{\partial g_1}, \dots \frac{\partial R_{pc}}{\partial g_n}\right] \text{ with } \frac{\partial R_{pc}}{\partial g_k} = \frac{1}{2}\frac{\bar{g}_k}{|g_k|+\varepsilon};$$

$$\frac{\partial g}{\partial x}$$

is a diagonal matrix with entries $$\left(\frac{\partial g}{\partial x}\right)_k = \frac{3|x_k|e^{-iP_k}}{2} - \bar{x}_k;$$

$$\frac{\partial R_{pc}}{\partial \bar{g}} = \overline{\left(\frac{\partial R_{pc}}{\partial g}\right)};$$

$$\frac{\partial \bar{g}}{\partial x}$$

is a diagonal matrix with entries $$\left(\frac{\partial \bar{g}}{\partial x}\right)_k = \frac{\overline{x_k}\overline{x_k}e^{iP_k}}{2(|x_k|+\varepsilon)} - \bar{x}_k.$$

ε is a positive small parameter to avoid 'division by zero'.

$\bar{x}$ represents the conjugate of x.

$(A)^*$ represents the conjugate transpose of matrix A.

One option is that: said W is constant in the process of iterative minimization. W is proportional to a magnitude image reconstructed by using all or part of the acquired k-space by setting $\lambda_{pc}$ to zero. In order to find the descent direction in said iterative minimization of the cost function $f_c$, the gradient of said phase constraint term $R_{pc}$ is calculated:

The gradient of $R_{pc}$ is:

$$\nabla R_{pc} = \left(\frac{\partial R_{pc}}{\partial x}\right)^* = \left(\frac{\partial R_{pc}}{\partial g}\frac{\partial g}{\partial x} + \frac{\partial R_{pc}}{\partial \bar{g}}\frac{\partial \bar{g}}{\partial x}\right)^*.$$

Where $$\frac{\partial R_{pc}}{\partial g} = \left[\frac{\partial R_{pc}}{\partial g_1}, \ldots \frac{\partial R_{pc}}{\partial g_n}\right] \text{ with } \frac{\partial R_{pc}}{\partial g_k} = \frac{1}{2}\frac{\bar{g}_k}{|g_k|+\varepsilon};$$

$$\frac{\partial g}{\partial x}$$

is a diagonal matrix with entries $$\left(\frac{\partial g}{\partial x}\right)_k = \left(1 - \frac{1}{2}\frac{\overline{x_k}}{|x_k|+\varepsilon}\right) \cdot W_k;$$

$$\frac{\partial R_{pc}}{\partial \bar{g}} = \overline{\left(\frac{\partial R_{pc}}{\partial g}\right)};$$

$$\frac{\partial \bar{g}}{\partial x}$$

is a diagonal matrix with entries $$\left(\frac{\partial \bar{g}}{\partial x}\right)_k = \left(-\frac{1}{2}\frac{\overline{x_k}}{|x_k|+\varepsilon}\right) \cdot W_k.$$

$\varepsilon$ is a positive small parameter to avoid 'division by zero'.

$\bar{x}$ represents the conjugate of x.

(A)* represents the conjugate transpose of matrix A.

Said reconstruction method is preferred to be applied to datasets acquired by said data acquisition method, but not limited to said data acquisition method.

Said reconstruction method is not limited to 3D MRI.

These, as well as other objects and advantages of this invention can be better understood and appreciated through careful study of the following detailed description of presently preferred exemplary embodiments of this invention in conjunction with the accompanying drawing.

In order to make the aforesaid and other features and advantages of the present invention more apparent to those skilled in the art, preferred embodiments of the present invention will be described in detail below by referring to the accompanying drawings, wherein identical numerals represent the same parts.

DESCRIPTION OF THE PREFERRED EMBODIMENT

Figure 1:
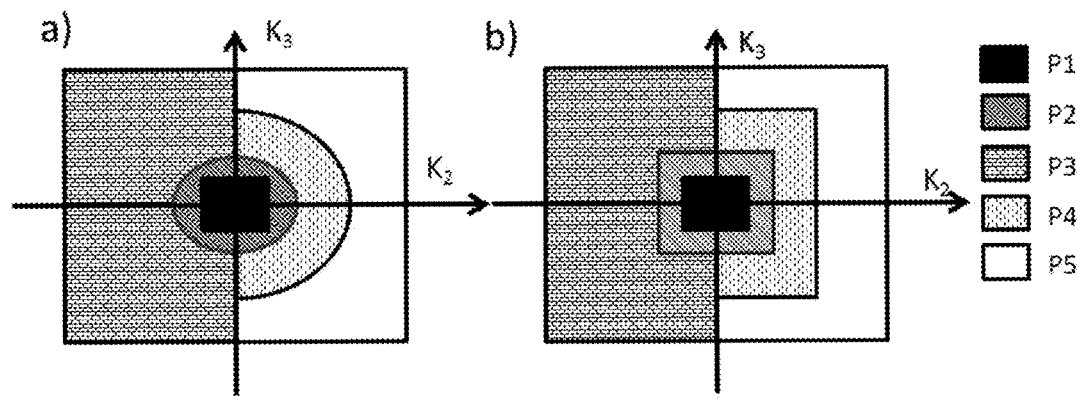
FIG. 1 shows an illustration of the distribution of the sampling density in k-space: a) Part 2 and Part 4 are in elliptical shape; b) Part 2 and Part 4 are in rectangular shape.
Figure 2:
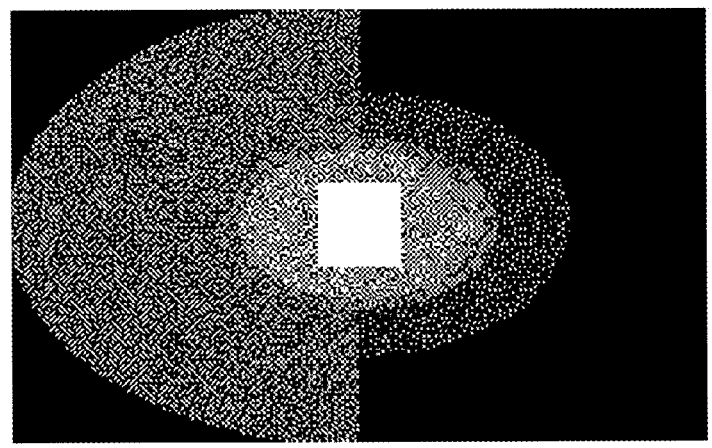
FIG. 2 shows an illustration of the generated sampling pattern from the distribution of the sampling density in FIG. 1a) with random sampling in gridded k-space.
Figure 3:
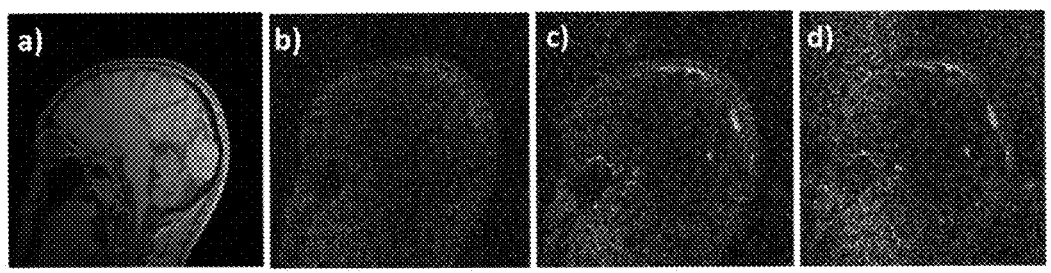
FIG. 3 shows a comparison of different reconstruction methods:
  a) Reference image
  b) Reconstruction error image with the invented method
  c) Reconstruction error image with POCS method in Reference [4]
  d) Reconstruction error image with Homodyne detection method in Reference [3].

In preferred embodiments of the present invention, the shape of the subsets of $k_2$-$k_3$ plane is rectangular. This is compatible with k-space regular undersampling, and the missing data are efficiently reconstructed using algorithm in Reference [7].

In an alternative embodiment of the invention, the shape of the subsets of $k_2$-$k_3$ plane is elliptical. Here, image phase is efficiently estimated with a limited amount of acquired k-space data.

In a further embodiment of the invention, wherein the estimate of the phase $P_R$ is taken from the reconstructed image by using only the symmetrically acquired data in Part 1 and Part 2 in $k_2$-$k_3$ plane. This variant of the method according to the present invention is simple and direct, and provides sufficient accuracy in regions with slow phase variation.

In another class of embodiments of the invention, the weighting map W is set to the magnitude of the intermediate solution x. The accuracy of the image phase estimation is dependent on the signal-to-noise ratio (=SNR). SNR is directly proportional to the intensity of the image pixels. The dependence on the phase constraint is reduced in regions with poor phase estimation to reduce the reconstruction error by applying the weighting map. By using the magnitude of the intermediate solution x as the weighting map, the weighting map is more precisely proportional to SNR when the iterative reconstruction converges, which can sufficiently suppress the artifacts in regions with poor SNR.

In an alternative class of embodiments of the invention, the weighting map W is set to the magnitude of a reconstructed image without using $R_{pc}$. $R_{pc}$ is convex term in all cases when the weighting map W is a constant magnitude image, which is reconstructed without using $R_{pc}$. The descent algorithm becomes more robust to find the optimal solution with convex regularization term.

The present invention discloses a method for accelerating magnetic resonance imaging, comprising: In 3D MRI, the k-space in the phase encoding plane is divided into two symmetric parts and three asymmetric parts. Different sampling densities are applied in different parts. Images are reconstructed by iteratively minimizing a cost function when random sampling is applied in each part. A phase constraint term is added into the cost function to improve the quality of the reconstruction by exploiting the conjugate symmetry of k-space.

While only certain features of the invention have been illustrated and described herein, many modifications and changes will occur to those skilled in the art. It is, therefore, to be understood that the appended claims are intended to cover all such modifications and changes as fall within the true spirit of the invention.

REFERENCES

[0] M. Bomans et al, Magn. Reson. Imaging 9, 597-609 (1991);
[1] Li F. et al, ISMRM 2011: 4368;
[2] Liu F. et al 2012 *Phys. Med. Biol.* 57 N391
[3] Nell, D. C., IEEE Trans. Med. Imaging, 10, 154-163, 1991;
[4] E M Hacke, J Magn Reson 1991; 92:126-145;
[5] Lustig M et al, MRM 2007, 1182-1195;
[6] Doneva M et al, ISMRM 2010: 485;
[7] Griswold, M. A., et al, Magn. Reson. Med., 47: 1202-1210.

We claim:

1. A magnetic resonance imaging method for the acquisition of a three-dimensional dataset, wherein spatial encoding by three mutually orthogonal magnetic field gradients is performed such that signals are readout under a read-gradient in one spatial direction $k_1$ with spatial encoding in the other two spatial directions $k_2$, $k_3$ being performed by applying phase encoding gradients in those other two spatial directions prior to signal acquisition, wherein data acquisition is performed in a sequential manner such that, at each acquisition step, signals are acquired under the readout gradient but with different combinations of the two phase encoding gradients, the method comprising the steps of:

a) fully sampling a k-space part 1 with a first sampling density, the k-space part 1 being a first subset of a $k_2$-$k_3$ plane, which is symmetric around a k-space center;
   b) undersampling, with a second, uniform sampling density which is lower than the first sampling density, a k-space part 2, the k-space part 2 being a second subset of the $k_2$-$k_3$ plane, which has higher spatial frequencies than those in k-space part 1 and which is symmetric around the k-space center;
   c) undersampling, with a third, uniform sampling density which is lower than the second sampling density, a k-space part 3, the k-space part 3 being a third subset in a lower half of the $k_2$-$k_3$ plane, which has higher spatial frequencies than those in part 2;
   d) undersampling, with a fourth, uniform sampling density which is lower than the third sampling density, a k-space part 4, the k-space part 4 being a fourth subset in an upper half of the $k_2$-$k_3$ plane, which has higher spatial frequencies than those in k-space part 2;
   e) acquiring no data within a k-space part 5, the k-space part 5 being a fifth subset in the upper half of the $k_2$-$k_3$ plane, which has higher spatial frequencies than those in k-space part 4; and
   f) reconstructing images by iteratively minimizing a cost function with descent algorithms, the cost function being a weighted summation of multiple regularization terms, with a phase constraint term $R_{pc}$ being introduced into the cost function, wherein $R_{pc}=\|g\|_1=\|(x \circ e^{-iP_R}-|x|) \circ W\|_1$, with x representing an intermediate solution in an iterative minimization; $\|g\|_1=\Sigma_k|g_k|$, with $g_k$ being a $k_{th}$ element of matrix g; A∘B representing a Hadamard product of a matrix A and a matrix B; |x| a magnitude of x; $P_R$ an estimate of a phase of images to be reconstructed and W a weighting map.

2. The method of claim 1, wherein a shape of subsets of the $k_2$-$k_3$ plane is rectangular.

3. The method of claim 1, wherein a shape of subsets of the $k_2$-$k_3$ plane is elliptical.

4. The method of claim 1, wherein the estimate of the phase $P_R$ is taken from a reconstructed image by using only symmetrically acquired data in part 1 and in part 2 in the $k_2$-$k_3$ plane.

5. The method of claim 1, wherein the weighting map W is set to the magnitude of the intermediate solution x.

6. The method of claim 1, wherein the weighting map W is set to a magnitude of a reconstructed image without using $R_{pc}$.

7. The method of claim 1, wherein a nonlinear conjugate gradient method is utilized in step f).

* * * * *